(12) United States Patent
Zommer

(10) Patent No.: US 8,575,767 B1
(45) Date of Patent: Nov. 5, 2013

(54) REFLOW OF THERMOPLASTIC SHEET FOR PASSIVATION OF POWER INTEGRATED CIRCUITS

(71) Applicant: IXYS Corporation, Milpitas, CA (US)

(72) Inventor: Nathan Zommer, Fort Lauderdale, FL (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 13/646,697

(22) Filed: Oct. 6, 2012

(51) Int. Cl.
*H01L 23/28* (2006.01)

(52) U.S. Cl.
USPC ............... 257/784; 257/795; 257/E23.121; 438/121

(58) Field of Classification Search
USPC ........... 257/784, 795, E21.121; 438/120, 121
See application file for complete search history.

(56) References Cited

U.S. PATENT DOCUMENTS

| | | | | |
|---|---|---|---|---|
| 5,086,018 | A | 2/1992 | Conru et al. | 437/207 |
| 6,404,065 | B1 | 6/2002 | Choi | 257/782 |
| 6,798,060 | B2 | 9/2004 | Strauch | 257/705 |
| 7,005,734 | B2 | 2/2006 | Choi et al. | 257/686 |
| 7,239,023 | B2 * | 7/2007 | Yu-Tung et al. | 257/778 |
| 2008/0093728 | A1 | 4/2008 | Mahler et al. | 257/701 |
| 2009/0315320 | A1 * | 12/2009 | Finn | 283/107 |
| 2010/0078834 | A1 * | 4/2010 | Bathan et al. | 257/795 |
| 2012/0055707 | A1 | 3/2012 | Schafer et al. | 174/260 |

FOREIGN PATENT DOCUMENTS

EP  1717863 B1  4/2005

OTHER PUBLICATIONS

RAD-3600F/12 LC Tape Laminator, Adwill, LINTEC Corporation, downloaded from http://www.lintec.co.jp/e-dept/english/adwill/di/laminator.html on Aug. 6, 2012 (2 pages).
LE Tape: Dicing Die Bonding Tage, Adwill, LINTEC Corporation, downloaded from http://www.lintec.co.jp/e-dept/english/adwill/di/diebonding.html on Aug. 6, 2012 (6 pages).

* cited by examiner

*Primary Examiner* — Roy Potter
(74) *Attorney, Agent, or Firm* — Imperium Patent Works; T. Lester Wallace

(57) ABSTRACT

A sheet of material includes a layer of the insulative thermoplastic material such as PET (poly(ethylene terephthalate)). The sheet is placed down over the wirebonds and a semiconductor die of a substrate assembly so that the sheet contacts the wirebonds and/or the semiconductor die. In one example, the sheet is a preform and the bottom of the sheet includes a layer of tacky adhesive that adheres the sheet to the substrate assembly. The sheet is then heated such that the PET softens and becomes conformal to the wirebonds and the semiconductor die of the upper surface of the substrate assembly. The resulting encapsulated substrate assembly is then encapsulated (for example, by overmolding in an injection molding process) to form a packaged semiconductor device. The conformal PET sheet is embedded within the packaged semiconductor device in such a way that it separates the wirebonds and semiconductor die from another encapsulant.

36 Claims, 7 Drawing Sheets

**ENCAPSULATE WITH INJECTION MOLDED PLASTIC
(CROSS-SECTIONAL SIDE VIEW)**

**WIREBONDED DBA/LEADFRAME ASSEMBLY
(PERSPECTIVE VIEW)**

**WIREBONDED DBA/LEADFRAME ASSEMBLY
(CROSS-SECTIONAL SIDE VIEW)**

CIRCUIT DIAGRAM

APPLY THE SHEET OF PET DIRECTLY
ONTO DICE AND WIREBONDS
(PERSPECTIVE VIEW)

APPLY THE SHEET OF PET DIRECTLY ONTO
DICE AND WIREBONDS
(CROSS-SECTIONAL SIDE VIEW)

CROSS-SECTIONAL VIEW OF
THE SHEET OF PET

HEAT TO 160°C-200°C SUCH THAT THE SHEET OF PET
REFLOWS TO BE CONFORMAL TO UPPER SURFACE OF
THE DBA/LEADFRAME ASSEMBLY
(PERSPECTIVE VIEW)

HEAT TO REFLOW THE PET TO BE CONFORMAL
(CROSS-SECTIONAL SIDE VIEW)

ENCAPSULATE WITH INJECTION MOLDED PLASTIC
(PERSPECTIVE VIEW)

ENCAPSULATE WITH INJECTION MOLDED PLASTIC
(CROSS-SECTIONAL SIDE VIEW)

CROSS-SECTIONAL VIEW OF A SHEET HAVING A BURIED PET LAYER

CROSS-SECTIONAL VIEW OF A SHEET HAVING A PET LAYER WITH EMBEDDED METAL PARTICLES

CROSS-SECTIONAL VIEW OF A SHEET HAVING A LAYER OF AN INSULATIVE POLYMER THAT DOES NOT REFLOW

CROSS-SECTIONAL VIEW OF A SHEET HAVING A CONTACT ADHESIVE LAYER

SUBSTRATE ASSEMBLY FOR A MULTI-CHIP
POWER MODULE

PREFORM SHEET HAVING A PET LAYER FOR A
MULTI-CHIP POWER MODULE

MULTI-CHIP POWER MODULE THAT CONTAINS A
PET-COATED SUBSTRATE ASSEMBLY

REFLOW OF THERMOPLASTIC SHEET FOR PASSIVATION OF POWER INTEGRATED CIRCUITS

TECHNICAL FIELD

The described embodiments relate to encapsulation of semiconductor devices, semiconductor device assemblies, and power modules.

BACKGROUND INFORMATION

The protective covering of a finished power semiconductor die within a semiconductor power device package is often colloquially referred to as "passivation." This layer actually performs several functions including that of a moisture barrier. One conventional passivation method involves depositing a layer of insulative glass directly on the semiconductor wafer prior to dicing the wafer into dice. Another passivation method involves applying a polymer layer, by dispensing a liquid directly onto the wafer, and then polymerizing the liquid in place on the wafer. Regardless of the method used to coat the wafer with passivation material, the passivation material on the wafer is then patterned so that passivation covers the active area of each die area of the wafer, but does not cover the streets (scribe line areas) between die areas where the wafer will be cut to separate the die areas, one from another. In addition, after wafer dicing the side edges of the dice are not covered with passivation. In high voltage power devices, the side edges of the dice may be part of an edge termination structure. The edge termination structure enables high voltage operation of the die without the die suffering breakdown problems. After having been singulated from the wafer, a resulting power semiconductor die is then fixed to a heat dissipating substrate. In a power semiconductor device, good thermal dissipation is generally required. There is no die stacking. It is important that the power device die lie flat on the heat dissipating substrate and that good thermal contact be maintained between the entire bottom side of the die and the substrate. Heat should also be able to escape from the top of the die. In one type of conventional power device, a different polymer material (for example, an epoxy resin molding compound) that is more suitable for forming the body of the semiconductor package is then injection molded to encapsulate the passivated die on the heat dissipating substrate. This molding compound, however, does not have all the desirable passivation qualities of the passivation material. For example, moisture generally penetrates the injection molded plastic material more easily than the passivation material. Accordingly, after incorporation of the die into the semiconductor package there still remain areas that are uncovered by the protective passivation coating such as the sidewalls of the die, the bond pad areas on the die where bondwires attach to the die, the bondwires that extend from the bond pads to package leads, and the scribe line areas around the periphery of the die.

SUMMARY

A sheet of material includes a layer of an insulative thermoplastic material, such as PET (poly(ethylene terephthalate)). In a novel encapsulation method, the sheet is placed down over the wirebonds and over a semiconductor die of a substrate assembly so that the sheet contacts the wirebonds and/or the semiconductor die. The substrate assembly may involve one semiconductor die, or multiple semiconductor dice. In one example, the bottom of the sheet includes a layer of tacky adhesive that adheres the bottom of the sheet to the upper surface of the substrate assembly. The sheet may be in the form of an elongated strip or tape, or may be in the form of a preform. When the sheet is in place on the substrate assembly, the sheet is heated such that the thermoplastic PET softens and becomes conformal to the wirebonds and to the semiconductor die and to the underlying surface topology of the upper surface of the substrate assembly. In one example, the sheet is heated by use of an infrared lamp and a flow of hot gas directed down onto the sheet. The downward force of the hot gas helps to force the softened PET into trenches and up against sidewalls and up against other small surface features of the upper surface of the substrate assembly. The PET layer of the sheet is thick enough that PET flows under the wirebonds and flows to be conformal to sidewalls of the semiconductor die or dice, but is nonetheless still thick enough to fully cover the tops of the wirebonds and the upper surfaces of the semiconductor die or dice. The resulting substrate assembly after PET reflow is said to be "encapsulated" with the conformal sheet. The term broader "encapsulation" is used here rather than the more commonly used term "passivation", because the reflowed PET layer serves protective functions beyond just that of passivation.

After reflow of the PET layer of the sheet, the encapsulated substrate assembly is incorporated as part of a power module package. In one example, PET-encapsulated substrate assembly is overmolded with an amount of another encapsulant. The encapsulant may be a resin encapsulant such as an epoxy resin, a polyurethane resin, or a silicone resin. The encapsulant may be formed by injection molding an epoxy resin molding compound. The overmolding with the encapsulant forms a packaged semiconductor device. The conformal PET sheet is embedded within the packaged semiconductor device in such a way that the PET sheet separates the wirebonds and semiconductor die (of the top of the substrate assembly) from the encapsulant that makes up the outer body of the packaged semiconductor device.

In one example, the sheet is not heated in a separate heating step before the encapsulant overmolding step occurs, but rather the high temperature conditions of the overmolding process itself are used to heat and reflow the PET and to make the PET conformal to the upper surface of the substrate assembly. The PET of the sheet is therefore heated and reflowed at the same time that the overmolding occurs.

In some examples, the sheet includes one or more layers other than the layer of PET. These other layers may include a layer of metal. The metal layer may perform an EMI shielding function. The other layers may include a layer having small embedded metal particles. The layer with embedded metal particles may be slightly conductive so that it performs a static charge dissipating function. The other layers may include a layer of an insulating polymer film that does not soften at PET reflow temperatures. Such a layer of insulating polymer film may perform the function of providing support for the underlying softened PET layer, or may perform the function of keeping a conductive metal layer covered with an insulative layer after the reflow step. The other layers may include a layer of contact adhesive that performs the function of securing the bottom of the sheet to the top of the underlying substrate assembly until the sheet can be heated and reflowed.

In one example, the sheet is a cut preform having holes. The preform sheet is placed down over the substrate assembly of a multi-chip power module. The assembly includes a plurality of upwardly extending metal posts/terminals that will be terminals of the ultimate multi-chip power device. For each such post/terminal, the preform sheet has a corresponding hole or peripheral edge indentation. The preform sheet fits down over the substrate assembly so that the sheet lies relatively flat on the upper surface of the substrate assembly, with the post/terminals extending upward through holes and peripheral edge indentations of the sheet. The sheet is then heated and reflowed to conformally encapsulate the upper surface of the substrate assembly, but for the upward extending posts/terminals that extend upward through holes in the sheet. In a multi-chip power device module, the PET-encapsulated substrate assembly is then incorporated into and is contained by a harder plastic housing. The posts/terminals extend through and out of the housing. The encapsulated assembly may be overmolded inside the housing by one or more other softer encapsulants. The PET-encapsulated assembly may, for example, be covered with a soft gel, and then the soft gel can be covered with an epoxy encapsulant. A surface of a metal plate upon which the substrate assembly is disposed, or a surface of the substrate assembly itself, may form an outer surface of the multi-chip power module. In some examples, the harder plastic housing is not provided with a hard plastic cover but rather the soft gel encapsulant that covers the PET-encapsulated substrate assembly is left uncovered. A PET-conformally coated multi-chip substrate assembly can be incorporated as part of almost any type of conventional power module package.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "front", "back", "top" and "bottom" are used herein to describe relative orientations between different parts of the structure being described, and it is to be understood that the overall structure being described can actually be oriented in any way in three-dimensional space.

Figure 1:
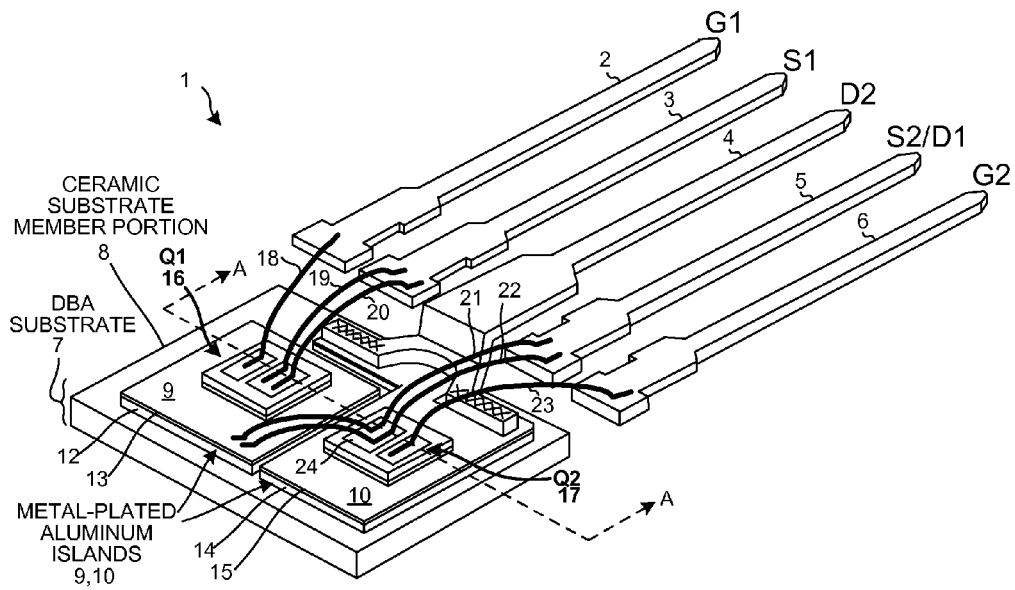
FIG. 1 is a simplified perspective view of a part of a DBA/leadframe assembly.

FIG. 1 is a simplified perspective view of a part of a DBA/leadframe assembly 1. The set of five metal leads 2-6 illustrated is one set of metal leads of a larger leadframe having more metal leads as is understood in the art. The leadframe is typically a piece of stamped thick copper sheeting. Although the leads 2-6 are shown in simplified form as separate leads in the diagram, at this point in the manufacturing process before leadframe trimming the leads are connected together by bridging portions of metal of the leadframe.

Assembly 1 also includes a row of identical Direct-Bonded Aluminum (DBA) substrates (also called a Direct Aluminum Bonded (DAB) substrate). The central lead of each set of leads is bonded, for example by soldering or ultrasonic welding, to a corresponding one of the DBAs. One of these DBA substrates 7 is pictured in the diagram of FIG. 1. The central lead 4 of the set of five leads has been ultrasonically welded to DBA substrate 7. DBA substrate 7 includes a thick ceramic substrate member 8, two thinner metal-plated aluminum islands 9 and 10. These islands 9 and 10 are bonded to top surface of ceramic substrate member 8. DBA substrate 7 also includes a thinner metal-plated aluminum island 11 that is bonded to the bottom surface of ceramic substrate member 8. In the illustrated example, metal-plated island 9 includes a central layer of aluminum 12, a thin layer 13 of a solderable metal (for example, copper, or nickel, or silver or gold), and a thin layer of Al—Si alloy. Similarly, metal-plated island 10 includes a central layer of aluminum 14, a thin layer 15 of a solderable metal (for example, copper, or nickel, or silver or gold), and a thin layer of Al—Si alloy. Similarly, metal-plated island 11 includes a central layer of aluminum, a thin layer of a solderable metal (for example, copper, or nickel, or silver or gold), and a thin layer of Al—Si alloy. The Al—Si alloy layers are provided on each metal island to promote adhesion between the metal of the island and the ceramic of the ceramic substrate member. For further details on the attachment of the metal islands to the ceramic substrate member, and for further information on direct metal bonded substrates in general, see: U.S. Pat. No. 6,798,060, U.S. Pat. No. 7,005,734, and U.S. Pat. No. 6,404,065 (the subject matter of these three patent documents is incorporated herein by reference).

Metallization on the backside of a first semiconductor die 16 is soldered or otherwise attached to the top side of metal-plated island 9. Metallization on the backside of a second semiconductor die 17 is soldered or otherwise attached to the top side of metal-plated island 10. Each semiconductor die includes one or more power devices such as, for example, power transistors and/or power diodes. In the illustrated example, semiconductor die 16 includes a single power field effect transistor Q1 and semiconductor die 17 includes a single power field effect transistor Q2. Wirebonds 18-23 are provided to connect bond pads on the upper surfaces of the dice to end portions of the leads and/or to other metal surfaces of the assembly. In the illustrated example, two of the wirebonds 21 and 22 also connect bond pad 24 of die 17 to the upper surface of island 9. The wirebond ends are ultrasonically welded in conventional fashion.

Figure 2:
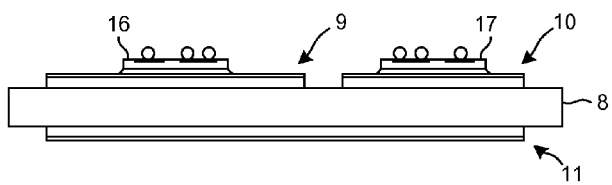
FIG. 2 is a simplified cross-sectional side view taken along sectional line A-A in FIG. 1.

FIG. 2 is a simplified cross-sectional side view taken along sectional line A-A in FIG. 1.

Figure 3:
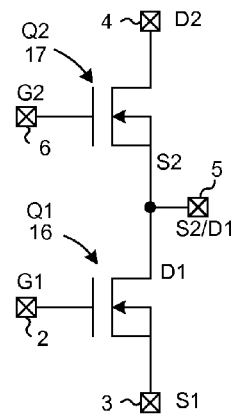
FIG. 3 is a circuit diagram of the part of the DBA/leadframe assembly of FIG. 1. The part of the DBA/leadframe assembly is a half-bridge circuit.

FIG. 3 is a circuit diagram of the portion of assembly 1 shown in FIG. 1. The circuit is a half-bridge involving two power field effect transistors Q1 and Q2, each realized on a different semiconductor die.

Figure 4:
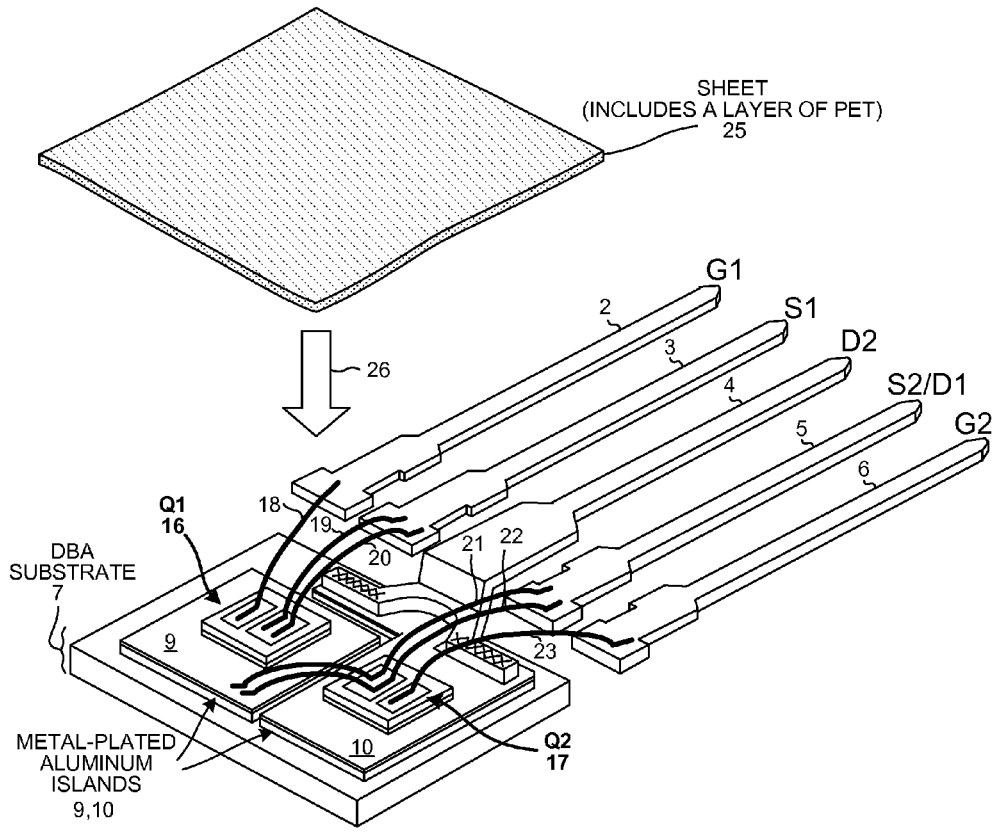
FIG. 4 is a perspective diagram that shows a step of applying a sheet (that includes a layer of PET) down over the dice, the wirebonds, and the ends of the leads of the part of the DBA/leadframe assembly of FIG. 1.

FIG. 4 is a perspective diagram that shows a step of applying a sheet 25 of material over the dice, the wirebonds, and the ends of the leads so that sheet 25 directly contacts and rests on the wirebonds and/or the dice and/or the top of the DBA substrate and/or the ends of the leads. In the specific example illustrated, sheet 25 is a single layer of a thermoplastic material, such as the thermoplastic material PET (poly(ethylene terephthalate)). The PET may be lower density ordinary PET, or may be higher density biaxially-oriented PET (referred to as BoPET). Sheet 25 is more than 200 microns thick but is preferably in one application much thicker. In FIG. 4, arrow 26 indicates that sheet 25 is brought closer to and is then pushed down onto the upper surface of the DBA/leadframe assembly of FIG. 1 so that the PET of sheet 25 directly contacts the upper surface of the DBA/leadframe assembly. Although sheet 25 is illustrated as a sheet of appropriate size to cover only one DBA substrate, the sheet 25 actually has an elongated strip or long tape shape because, as explained above, the portion pictured in FIG. 4 is actually just part of a larger DBA/leadframe assembly. In one example, the larger DBA/leadframe assembly includes a row of ten DBA substrates, each of which is ultrasonically welded to the metal leadframe. The sheet 25 is therefore a strip long enough to cover the entire row of ten DBA substrates.

Figure 5:
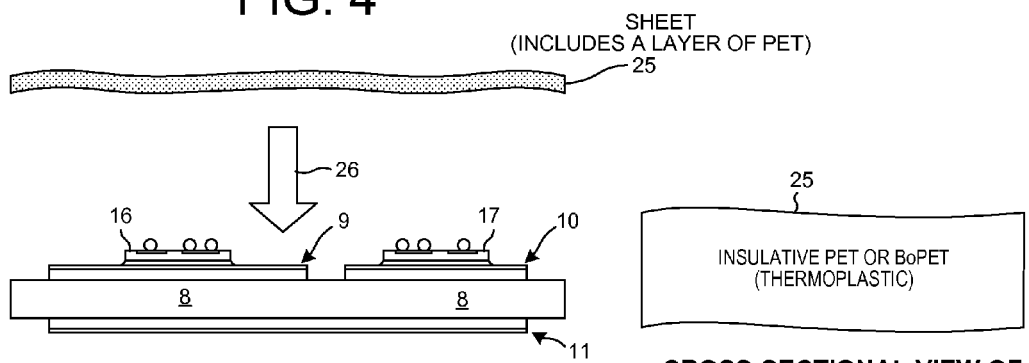
FIG. 5 is a simplified cross-sectional side view of FIG. 4.

FIG. 5 is a simplified cross-sectional side view of FIG. 4.

Figure 6:
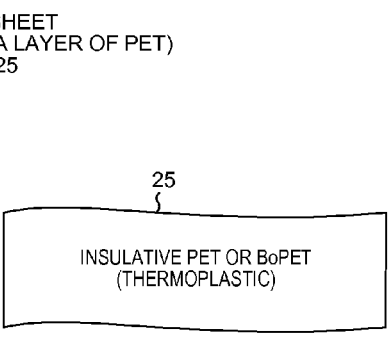
FIG. 6 is a cross-sectional view of the sheet of FIG. 4.

FIG. 6 is a cross-sectional view of sheet 25.

Figure 7:
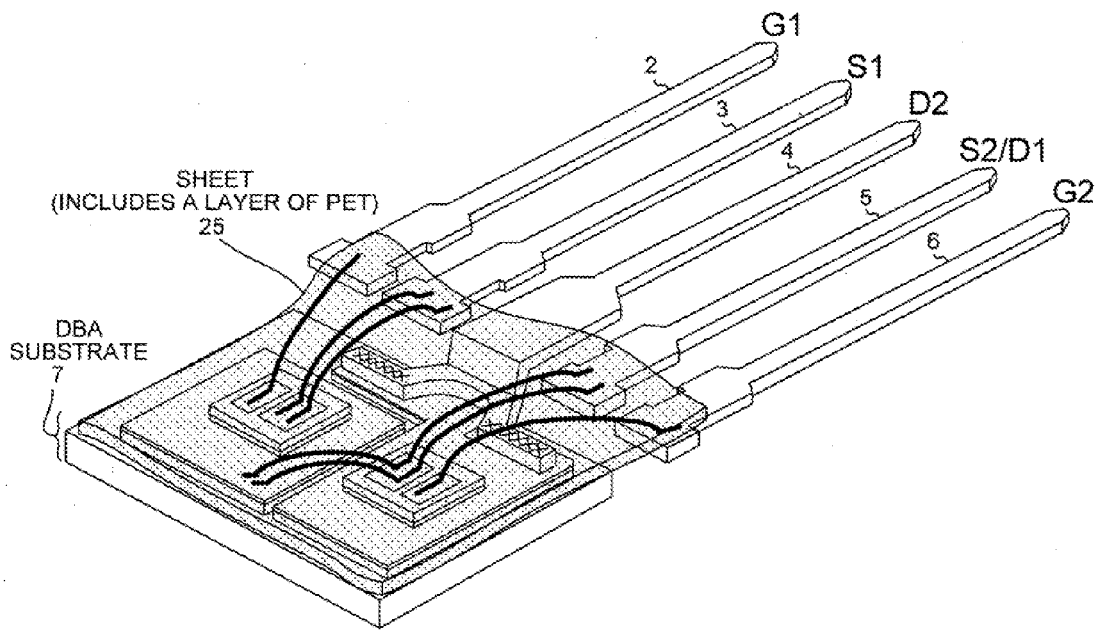
FIG. 7 is a perspective diagram that shows a step of heating the sheet of FIG. 4 to an adequately high temperature that the thermoplastic PET of the sheet softens and the sheet becomes conformal to the upper surface of the DBA/leadframe assembly.

FIG. 7 is a perspective diagram that shows a subsequent step of heating the sheet 25 of FIG. 4 to an adequately high temperature above PET's glass transition temperature (Tg) that the thermoplastic PET portion of sheet 25 softens.

Figure 8:
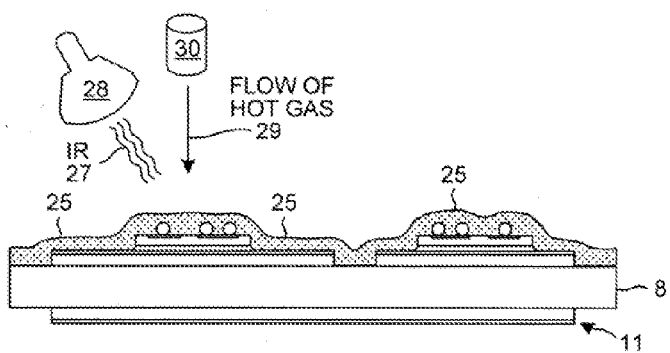
FIG. 8 is a simplified cross-sectional side view of FIG. 7.

FIG. 8 is a simplified cross-sectional side view of FIG. 7. The temperature to which sheet 25 is heated depends on the type of PET employed and the duration of the heating step, but is typically in a range of 160° C. to 200° C. PET is a thermoplastic that has a glass transition temperature (Tg) of approximately 82° C. The softening of the PET allows the PET to reflow and to become conformal to the upper surface of the DBA assembly of FIG. 1. The softened PET is of such a viscosity that it flows around and under wirebonds. The PET of sheet 25 is made adequately thick that there is enough PET on the top of the structure after this reflowing that sheet 25 still covers all of the upper surface of DBA/leadframe assembly, including all upper surfaces of all the wirebonds. The resulting structure is as shown in FIG. 7. Sheet 25 is wide enough that it covers the ends of the wirebonds that attach to ends of the leads. The PET also flows laterally to cover sidewalls of the dice 16 and 17 as illustrated in FIG. 8. The PET flows downward to cover sidewalls of islands 9 and 10 as illustrated in FIG. 8. The strip-shaped sheet bridges between adjacent DBAs of the DBA/leadframe assembly during the heating and reflow step. These bridging portions of the sheet are not shown in the simplified diagram of FIG. 8.

In one example, sheet 25 is heated by infrared radiation 27 from an infrared lamp 28 in combination with a directed flow of hot gas 29 from a hot air gun 30. The directed flow of hot gas 29 exerts a force downward on the softened sheet 25. This downward force facilitates flowing of the softened PET down into narrow trench features and onto sidewall surface features of the DBA/leadframe assembly. The DBA/leadframe assembly may be moved under lamp 28 and heat gun 30 such that the portions of sheet 25 over the DBAs are heated and reflowed, one at a time. Alternatively, the entire DBA/leadframe assembly can be heated and the sheet reflowed over many DBAs at one time by placing the entire DBA/leadframe into suitably large oven. The heating step can be performed in a nitrogen environment, or in an environment of a forming gas (hydrogen, for example), or any other suitable and desirable gas or combination of gases.

In one example, an electron beam (EB) is used to treat sheet 25 or a layer or layers of sheet 25, as preparation, before sheet 25 is used in the reflow process. EB treatment creates additional cross linking of molecules within the PET polymer. As compared to non-EB treated films, EB treatment may impart desirable qualities to sheet 25 such as: better adhesion to the underlying substrate assembly after the heating step, better resistance to moisture penetration, higher material density due to the extra level of polymerization, better resistance to penetration of contaminants through the sheet, better thermal conductivity of the sheet, better dielectric strength resulting in a higher breakdown voltage rating of the semiconductor device, reduced surface leakage currents on the surfaces of the dice being coated with the sheet, better dielectric properties in radio frequency applications due to lower RF loses in the sheet, and better heat resistance (the sheet can withstand higher temperatures of operation without degrading). EB treatment in one example involves an electron beam having an energy in the 100 keV to 3 meV range, with doses of 100 kilorads to 20 mega-rads.

Figure 9:
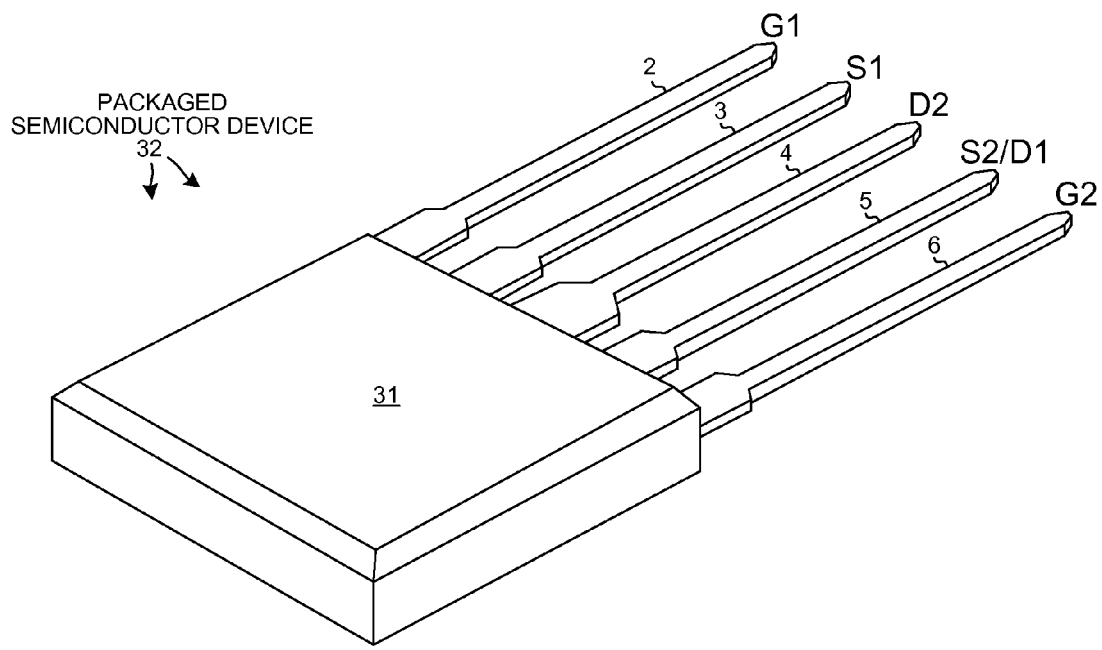
FIG. 9 is a perspective diagram that shows the result of a step of encapsulating the reflowed structure of FIG. 7 with an amount of plastic encapsulant.

FIG. 9 is a perspective diagram that shows the result of a subsequent step of encapsulating the reflowed structure of FIG. 7 with an amount of plastic encapsulant 31. The bridging portions of the PET tape that bridge between adjacent DBAs of the DBA/leadframe assembly are trimmed away or otherwise removed prior to this encapsulation step. In the illustrated example, the encapsulating step is a conventional injection molding step used in semiconductor device packaging. A molding compound, which typically includes epoxy resin, a hardener, a catalyst, an organic filler, and a release agent, is injected into a mold. After suitable pressure and temperature in the mold, the molding compound polymerized and forms the volume of hardened resin encapsulant 31. Resin encapsulant 31 contacts the upper surface of the reflowed sheet 25, and also forms a first part of the outside surface of the resulting packaged semiconductor device 32. In the specific embodiment of FIGS. 9 and 10, the bottom of the DBA is not covered with encapsulant 31. The bottom of the DBA therefore forms a second part of the outside surface of the packaged semiconductor device 32. In the specific embodiment of FIGS. 9 and 10, no portion of the encapsulant contacts the dice or the wirebonds. The reflowed sheet 25 separates the dice and wirebonds from the encapsulant 31. After encapsulation, the leads 2-6 are plated (for example, are tin plated).

Figure 10:
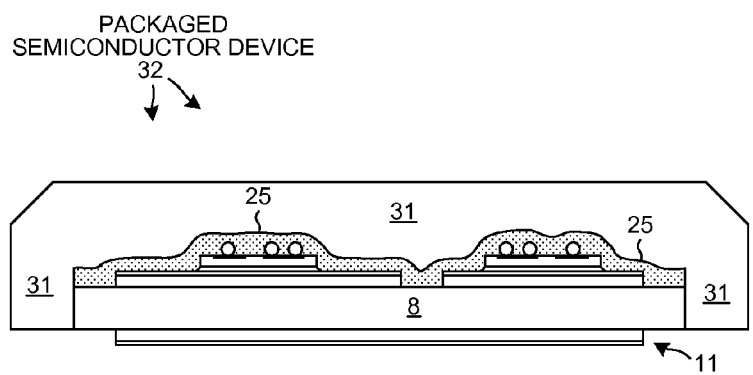
FIG. 10 is a cross-sectional view of the packaged semiconductor device of FIG. 9.

Leadframe trimming and lead forming are then carried out. FIG. 9 is a diagram of one of the resulting packaged semiconductor devices 32. FIG. 10 is a cross-sectional view of the packaged semiconductor device 32 of FIG. 9.

In one advantageous aspect, sheet 25 within packaged semiconductor device 32 includes no polyimide and no polyimide layer. Polyimide sheeting is typically expensive, is difficult to handle, and can have a bad effect on breakdown voltage between structures on the top of a DBA and between DBA bondwires in a power device. Moreover, polyimide sheeting may function to impede the reflow of PET were the PET to have been initially carried on the polyimide sheeting. In contrast to polyimide, a relatively thick PET layer in the absence of polyimide is generally less expensive, is easier to handle, results in a packaged power semiconductor device having superior breakdown voltage characteristics, and has superior reflow qualities.

Although an embodiment is set forth above in which the substrate is a DBA, the substrate to which the semiconductor dice are attached can be another type of substrate. In one common example, the substrate is a metal slug extension of a lead of the leadframe. Although an embodiment is set forth above in which sheet 25 is a single layer of PET, sheet 25 may include other layers in other embodiments. FIGS. 11-14 show four such other embodiments where sheet 25 is a multi-layer sheet.

Figure 11:
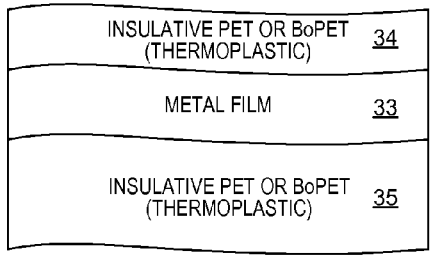
FIG. 11 shows an embodiment in which the sheet includes a buried metal layer or film.

FIG. 11 shows an embodiment in which sheet 25 includes a buried metal layer or film 33. The metal layer 33 is sandwiched between two PET layers 34 and 35 so that the buried metal layer is insulated from outside the sheet. The metal of layer 33 may be deposited on one of the PET layers by evaporative deposition. Layer 33 can have a small sheet resistance such that it operates as an EMI shield or part of a Faraday cage within the packaged semiconductor device. Layer 33 may, or may not, be electrically coupled to a lead of the packaged device.

Figure 12:
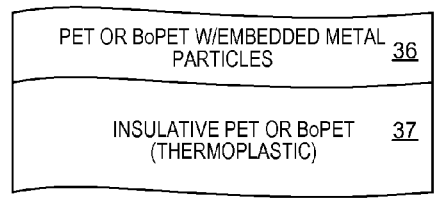
FIG. 12 shows an embodiment in which the sheet includes a PET layer having embedded metal particles.

FIG. 12 shows an embodiment in which a PET layer 36 includes embedded metal particles. PET layer 37 is a layer of PET without embedded particles, and therefore is insulative. Layer 36 can have a sheet resistance such that it dissipates static electrical charges and prevents large static electrical charges from building up on the surface of sheet 25. Layer 36 may, or may not, be electrically coupled to a lead of the packaged device.

Figure 13:
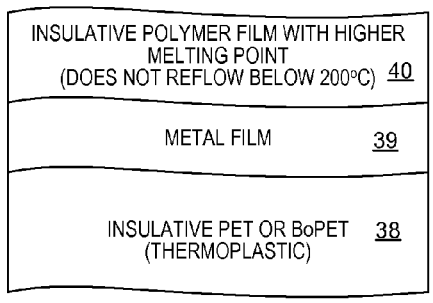
FIG. 13 shows an embodiment in which the sheet has a metal layer covered with an insulative polymer layer, where the insulative polymer layer does not reflow during the PET reflow step.

FIG. 13 shows an embodiment having an insulative PET layer 38, covered by a metal film layer 39, covered by another insulative layer as in the embodiment of FIG. 11, except that in the example of FIG. 13 the top insulative layer 40 is an insulative polymer film that does not reflow at the reflow temperature at which the PET of sheet 25 is reflowed. Layer 40, in one example, is a layer of polyimide. Layer 40 is provided to provide an insulative layer over the conductive metal layer 39 to prevent inadvertent conduction through metal layer 39 that might otherwise damage the semiconductor devices of the part. The insulative polymer layer 40 does not melt during the reflow step, so the insulative material of layer 40 does not move and thin out and leave exposed uninsulated surface areas of metal film 39.

Figure 14:
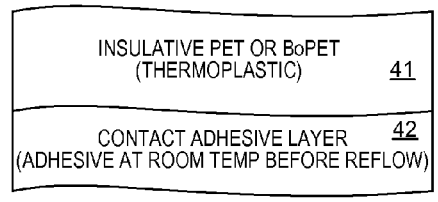
FIG. 14 shows an embodiment in which the sheet has a tacky contact adhesive layer.

FIG. 14 shows an embodiment having a PET layer 41 and a tacky contact adhesive layer 42. The tacky contact adhesive layer 42 is adhesive at room temperature before the reflow step and is used to adhere the sheet 25 to the underlying DBA/leadframe assembly prior until the PET can be reflowed. The adhesive or glue prevents the sheet 25 from blowing off due to vibration or a flow of gas before sheet 25 reflows and becomes permanently fixed to the DBA. The various layer of FIGS. 11-14, as well as layers of other materials having other specific passivation, shielding, thermal conductivity, and electrical performance qualities, can be stacked in any desired combination to form sheet 25, as long as the bottom layer of the sheet 25 that is in contact with the wirebonds and semiconductor dice is of insulating polymer material.

The conformal sheet 25 is formed in a process that is specific to the fabrication of the sheet. It is not done on the surface of the semiconductor device to be encapsulated. The fact that polymerization and manufacture of sheet 25 occurs elsewhere and not on the surface of the semiconductor device gives numerous degrees of freedom in the processing and manufacture of sheet 25. Encapsulation layers formed on the surfaces of the devices they are to passivate, from liquid form, or by CVD (Chemical Vapor Deposition), are limited by the desire not to damage the underlying semiconductor devices during the encapsulation process. In the novel encapsulation methods set forth here, on the other hand, the sheet 25 is made and polymerized in a separate process, using different equipment. Accordingly, materials, temperatures, pressures, gases, etc. can be used to make sheet 25 that could not have been used were the encapsulation sheet being polymerized on the surface of the substrate assembly. This feature of the disclosed encapsulation method enables better polymer films, with better desired qualities, than prior art processes involving polymerization on the devices to be protected. The same substrate assembly and semiconductor device type can, in different applications and packages, be coated with different types of conformal sheets. The film properties of the sheet used are tailored to suit the particular application even though the underlying substrate assembly and its semiconductor devices are identical in the different applications.

Figure 15:
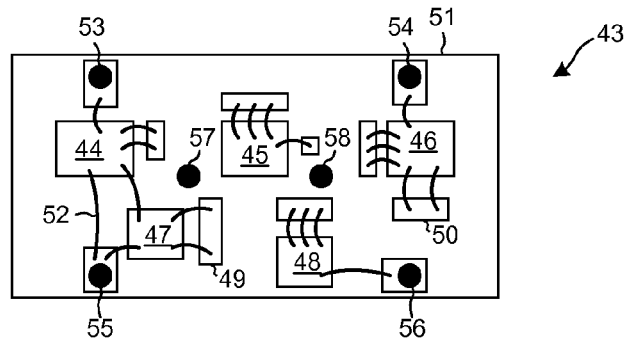
FIG. 15 is a top-down diagram of another embodiment in which a sheet that includes a layer of PET is made to be conformal to the upper surface of a substrate assembly of a multi-chip power module.

FIG. 15 is a top-down diagram of another embodiment in which a sheet 59 that includes a layer of PET is made to be conformal to the upper surface of a substrate assembly 43 within a multi-chip power module. Substrate assembly 43 includes a plurality of power semiconductor devices 44-48 and other surface mount components 49-50. The semiconductor devices and other surface mount components are attached to the upper surface of a multi-layer substrate 51. Multi-layer substrate 51 may, for example, be a multi-layer ceramic substrate that has multiple layers of patterned interconnect. Bond pads on the upper surfaces of the semiconductor dice 44-48 are attached by wirebonds to various parts of the substrate 51 and to other components. Reference numeral 52 identifies one such wirebond. In addition to semiconductor devices and the other surface mount components, substrate assembly 43 also includes a plurality of vertically extending metal terminal posts 53-58. The metal terminal posts 53-58, may for example, be soldered or ultrasonically welded to substrate 51.

Figure 16:
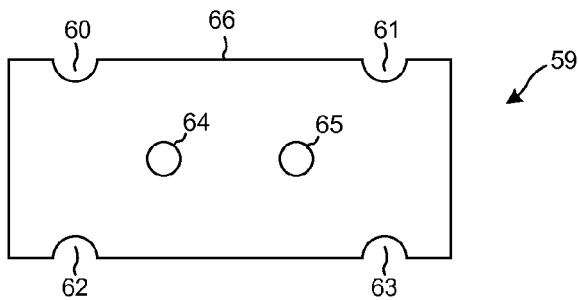
FIG. 16 is a top-down diagram of the sheet that covers the substrate assembly of FIG. 15.

FIG. 16 is a diagram of the sheet 59 that includes the layer of PET. Sheet 59 may involve multiple layers, but the bottom layer of sheet 59 is an insulative and reflowable layer of PET. Unlike the embodiment of FIGS. 1-10 set forth above where sheet 25 has a elongated strip or long tape shape, in the embodiment of FIG. 15 the sheet 59 is a patterned preform that has circular holes 64 and 65 and a shaped outer peripheral edge 66. Semi-circular indentations 60-63 are formed in the peripheral edge 59. The shaped outer peripheral edge 66 is of a size and shape such that sheet 59 falls within the outer peripheral boundary of substrate 51 when the sheet 59 and substrate assembly 43 are considered from the top-down perspective. The holes 64-65 and outer peripheral edge 66 of preform sheet 59 are shaped so that certain selected parts of the underlying substrate assembly 43 are not be covered by sheet 59. In the illustrated embodiment, sheet 59 fits down over the terminal posts 53-58 such that terminal posts 53-58 fit through holes and indentations 60-65, respectively. With the sheet 59 in place in this way, the sheet 59 is heated. The PET of the sheet reflows and becomes conformal to the upper surface topology of substrate assembly 43. After the PET reflow encapsulation step is completed, the resulting encapsulated substrate assembly is placed in a shallow tray or tub 68 (see FIG. 17) of a suitable material. In one example, the tray or tub 68 is made of a relatively hard plastic. The substrate assembly 43 fits down into the bottom of this tray or tub 68 in a snug manner. A soft gel material, such as for example a polyurethane resin gel material, is then poured into the tray or tub 68 so that the gel covers the substrate assembly 43. The gel is then cured. In one example, the gel is a polyurethane resin that has a self-healing soft rubbery gel quality. An epoxy resin layer is then sometimes poured into the tray or tub over the soft gel, and the epoxy resin is cured. One or both of the curing steps may be performed in a vacuum so that the gel and epoxy layers do not contain bubbles of air or gas. Thereafter a cover 69 of hardened plastic is placed over the rim of the tray or tub 68, thereby forming a closed housing of hardened plastic material that seals the PET-encapsulated and overmolded substrate assembly inside the housing. The posts/terminals extend through and out of the housing so that the posts/terminals form terminals of the resulting multi-chip power module. In such a multi-chip power module, the post/terminals can extend out of the housing through a slit or holes in the sides of the housing and/or through a slit or holes in the cover of the housing.

Figure 17:
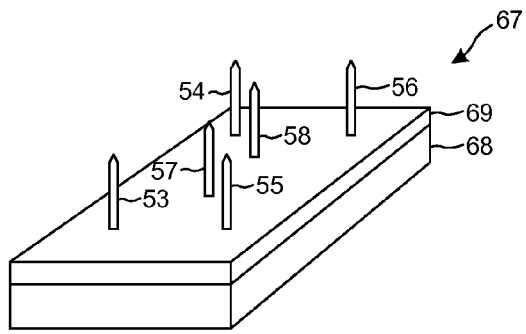
FIG. 17 is a perspective view of a multi-chip power module that contains a PET-encapsulated substrate assembly.

FIG. 17 is a perspective diagram of the resulting multi-chip power module 67 that contains the PET-encapsulated substrate assembly 43. The housing includes tray or tub portion 68 and cover portion 69. Terminal posts 53-58 are shown extending up and through the cover portion 69.

In many cases, rather than the housing entirely encasing the substrate so that plastic of the housing forms most all of the outside of the package, a metal plate or a surface of the substrate forms an outer surface of the finished module package. In many cases, the hard plastic housing tray is not provided with a cover but rather the module package is left without a cover and with its soft gel exposed. Accordingly, in one novel aspect, a PET-conformally coated multi-chip substrate assembly can be incorporated as part of almost any type of conventional power module package.

Figure 18:
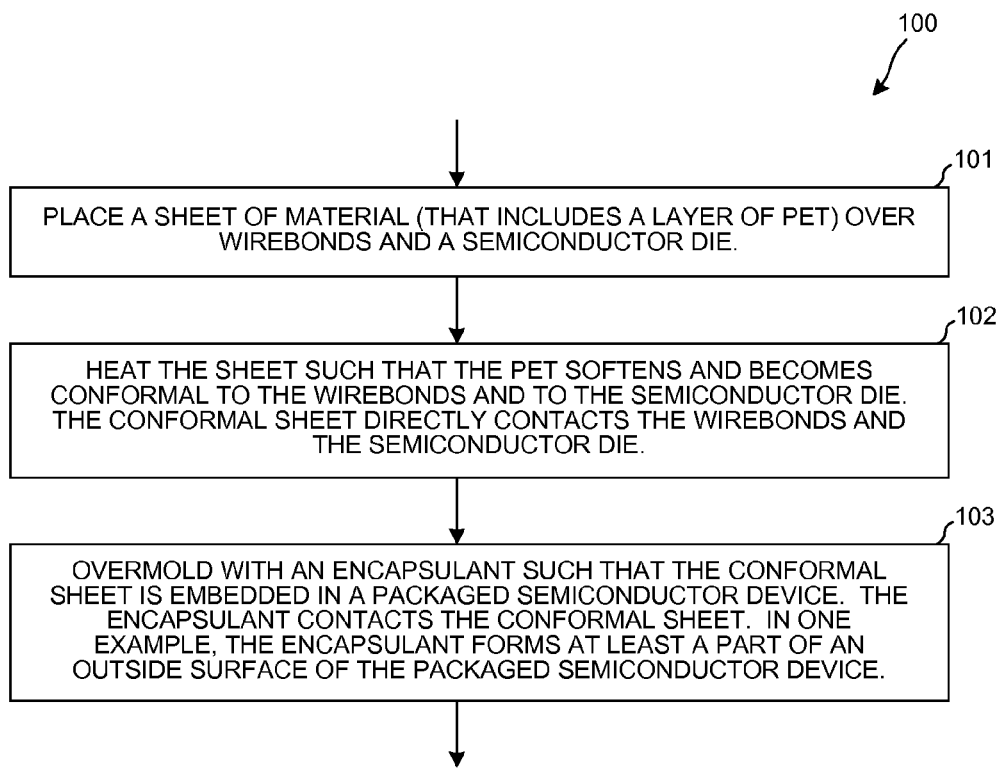
FIG. 18 is a flowchart of a method in accordance with one novel aspect.

FIG. 18 is a flowchart of a method 100 in accordance with one novel aspect. A sheet of material includes a layer of PET. This sheet is placed (step 101) over wirebonds and a semiconductor die of an assembly. The sheet may cover one die, or may cover multiple dice and other components in this way. After the sheet has been positioned, the sheet is heated (step 102) such that the PET softens and becomes conformal to the wirebonds and to the semiconductor die or dice and other surface topology of the assembly. The conformal sheet directly contacts the wirebonds and the semiconductor die or dice. The conformal sheet is then overmolded (step 103) with an encapsulant such that the conformal sheet is embedded in a packaged semiconductor device. The encapsulant contacts and covers the conformal sheet of material. In one example, the packaged semiconductor device is the packaged semiconductor device of FIGS. 9 and 10 and the encapsulant forms at least a part of an outside surface of the packaged semiconductor device. In another example, the overmolded encapsulant is an encapsulant within a multi-chip power module, where the encapsulant is a relatively soft rubbery gel encapsulant that is entirely contained within an outer housing of relatively harder plastic material.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A packaged semiconductor device, comprising:
   a substrate;
   a semiconductor die attached to the substrate;
   wirebonds attached to the die;
   a sheet of material that extends over the semiconductor die, the wirebonds, and at least part of the substrate, wherein the sheet of material is substantially conformal to the wirebonds and to the die and directly contacts the wirebonds and the semiconductor die, wherein the sheet of material comprises a layer of PET (poly(ethylene terephthalate)); and
   an amount of resin encapsulant that covers the sheet of material and contacts the sheet of material.

2. The packaged semiconductor device of claim 1, wherein the PET is BoPET (biaxially-oriented poly(ethylene terephthalate)).

3. The packaged semiconductor device of claim 1, wherein the sheet of material includes substantially no polyimide material.

4. The packaged semiconductor device of claim 1, wherein the amount of resin encapsulant forms a first outside surface of the packaged semiconductor device, and wherein the substrate forms a second outside surface of the packaged semiconductor device.

5. The packaged semiconductor device of claim 1, further comprising:
   a metal lead, wherein the substrate is a metal slug from which the metal lead extends.

6. The packaged semiconductor device of claim 1, wherein the substrate has a ceramic layer, and wherein the substrate is taken from the group consisting of: a DBA (Direct-Bonded Aluminum) substrate, a DBC (Direct-Bonded Copper) substrate.

7. The packaged semiconductor device of claim 1, wherein the packaged semiconductor device is a multi-chip power module.

8. The packaged semiconductor device of claim 1, wherein the resin encapsulant is taken from the group consisting of: epoxy resin, polyurethane resin, silicone resin.

9. The packaged semiconductor device of claim 1, wherein substantially no resin encapsulant contacts the semiconductor die.

10. The packaged semiconductor device of claim 1, wherein the semiconductor die has sidewalls, and wherein the sheet of material is conformal to and directly contacts the sidewalls.

11. A method comprising:
   (a) placing a sheet of material over wirebonds and a semiconductor die, wherein the die is attached to a substrate, wherein the wirebonds are attached to the semiconductor die, and wherein the sheet of material comprises a layer of PET poly(ethylene terephthalate);
   (b) heating the sheet of material such that the sheet of material softens and becomes conformal to the wirebonds and to the semiconductor die, wherein the conformal sheet of material directly contacts the wirebonds and the semiconductor die; and (c) overmolding the semiconductor die, the wirebonds, the conformal sheet of material, and at least a part of the substrate in a resin encapsulant material, wherein the resin encapsulant material contacts the conformal sheet of material.

12. The method of claim 11, wherein the PET is BoPET (biaxially-oriented poly(ethylene terephthalate)).

13. The method of claim 11, wherein the sheet of material in (a) includes substantially no polyimide material.

14. The method of claim 11, wherein (b) involves using a heat lamp to heat the sheet of material.

15. The method of claim 11, wherein (b) involves directing a flow of a hot gas at the sheet of material.

16. The method of claim 11, wherein the sheet of material in (a) further comprises a tacky adhesive layer, and wherein the tacky adhesive layer adheres the sheet of material to the wirebonds and to the semiconductor die prior to the heating of (b).

17. The method of claim 11, wherein the sheet of material is placed in (a) such that the PET directly contacts the wirebonds, the semiconductor die, and the substrate.

18. The method of claim 11, wherein the overmolding of (c) involves injection molding the resin encapsulant material, and wherein the heating of (b) occurs during the injection molding of the resin encapsulant material.

19. The method of claim 11, wherein the sheet of material further comprises a layer of a metal.

20. The method of claim 11, wherein the sheet of material further comprises a layer comprising metal particles.

21. The method of claim 11, wherein the resin encapsulant material includes a material taken from the group consisting of: epoxy resin, polyurethane resin, silicone resin.

22. The method of claim 11, wherein the substrate is one of a plurality of substrates, wherein each of the plurality of substrates is attached to a leadframe, and wherein the sheet of material is a strip that extends over and contacts each of the plurality of substrates.

23. The method of claim 11, further comprising:
(d) Electron Beam (EB) treating the sheet of material thereby increasing the polymerization of the layer of thermoplastic material, wherein the EB treating of (d) occurs prior to (a).

24. A packaged semiconductor device comprising:
a substrate;
a semiconductor die attached to the substrate, wherein the semiconductor die has sidewalls;
a wirebond attached to the semiconductor die;
an amount of resin encapsulant that forms an outside surface of the packaged semiconductor device, wherein the outside surface extends over the semiconductor die; and
means for conformally covering the semiconductor die, the wirebond, and a portion of the substrate with a layer of reflowed thermoplastic sheeting such that the reflowed thermoplastic sheeting is disposed between the semiconductor die and the amount of resin encapsulant, and wherein the means directly contacts the sidewalls of the semiconductor die, the wirebond, and the portion of the substrate.

25. The packaged semiconductor device of claim 24, wherein the reflowed thermoplastic sheeting is a sheet of a thermoplastic material taken from the group consisting of: PET (poly(ethylene terephthalate)), BoPET (biaxially-oriented poly(ethylene terephthalate)), and wherein the means includes substantially no polyimide material.

26. The packaged semiconductor device of claim 24, wherein the means is for conformally covering the semiconductor die such that substantially none of the resin encapsulant contacts the semiconductor die.

27. The packaged semiconductor device of claim 24, wherein the packaged semiconductor device is a multi-chip power module having a terminal post, and wherein the means is also for providing a hole through which the terminal post extends.

28. A packaged multi-chip power module, comprising:
a substrate;
a plurality of power semiconductor dice attached to the substrate;
a wirebond attached to at least one of the dice;
a sheet of material that extends over the dice, the wirebond, and at least part of the substrate, wherein the sheet of material is substantially conformal to the wirebond and to the dice and directly contacts the wirebond and the dice, wherein the sheet of material comprises a layer of PET (poly(ethylene terephthalate)); and
a housing that houses the substrate, the dice, the wirebond, and the sheet of material.

29. The packaged multi-chip power module of claim 28, further comprising:
a volume of soft gel encapsulant material that contacts the sheet.

30. The packaged multi-chip power module of claim 28, further comprising:
a metal terminal that extends from the substrate, through the sheet, and through the housing.

31. The packaged multi-chip power module of claim 28, wherein one of the power semiconductor dice has a sidewall, and wherein the sheet of material is conformal to the sidewall.

32. The packaged multi-chip power module of claim 28, wherein a surface of the substrate is an outside surface of the packaged multi-chip power module.

33. The packaged multi-chip power module of claim 28, further comprising:
a metal plate upon which the substrate is disposed, wherein the metal plate and the housing together contain the substrate, dice, wirebond, and sheet within the packaged multi-chip power module.

34. A method comprising:
(a) placing a sheet of material over wirebonds and a semiconductor die, wherein the die is attached to a substrate, wherein the wirebonds are attached to the semiconductor die, and wherein the sheet of material comprises a layer of PET (poly(ethylene terephthalate));
(b) heating the sheet of material such that the sheet of material softens and becomes conformal to the wirebonds and to the semiconductor die thereby forming a PET-coated substrate assembly, wherein the conformal sheet of material directly contacts the wirebonds and the semiconductor die of the PET-coated substrate assembly; and
(c) incorporating the PET-coated substrate assembly into a power module.

35. The method of claim 34, wherein the sheet of material includes no polyimide layer, wherein the incorporating of (c) involves overmolding with a resin encapsulant in an injection molding process, and wherein the sheet of material is heated in (b) at the same time that the overmolding with the resin encapsulant occurs.

36. The method of claim 34, wherein the sheet of material includes no polyimide layer, and wherein the incorporating of (c) involves placing the PET-coated substrate assembly into a hard plastic housing.

* * * * *